United States Patent [19]

Lee

[11] Patent Number: 4,824,763

[45] Date of Patent: Apr. 25, 1989

[54] TRIAMINE POSITIVE PHOTORESIST STRIPPING COMPOSITION AND PREBAKING PROCESS

[75] Inventor: Wai M. Lee, Milpitas, Calif.

[73] Assignee: EKC Technology, Inc., Hayward, Calif.

[21] Appl. No.: 79,714

[22] Filed: Jul. 30, 1987

[51] Int. Cl.$^4$ ............................ G03F 7/00; G03C 5/00
[52] U.S. Cl. .................... 430/258; 430/326; 430/329; 430/330; 430/331; 252/153; 252/171; 252/542; 252/544; 252/DIG. 8
[58] Field of Search ............... 430/331, 329, 330, 260, 430/326, 258; 252/542, 544, 153, 171, DIG. 8; 134/34

[56] References Cited

U.S. PATENT DOCUMENTS

| | | | |
|---|---|---|---|
| 3,649,544 | 3/1972 | Gotte et al. | 252/544 |
| 4,072,528 | 2/1978 | Bratt | 430/331 |
| 4,311,618 | 1/1982 | Schäfer-Burkhard | 252/544 |
| 4,401,748 | 8/1983 | Ward Jr. et al. | 430/329 |
| 4,403,029 | 9/1983 | Ward, Jr. et al. | 430/329 |
| 4,666,824 | 5/1977 | Messer | 430/330 |

FOREIGN PATENT DOCUMENTS

| | | | |
|---|---|---|---|
| 134891 | 8/1984 | Japan | 252/544 |
| 96695 | 5/1985 | Japan | 252/544 |

Primary Examiner—Paul R. Michl
Assistant Examiner—Lee C. Wright
Attorney, Agent, or Firm—Flehr, Hohbach, Test, Albritton & Herbert

[57] ABSTRACT

A stripping composition for removing positive organic photoresist from a substrate, such as a semiconductor wafer, contains a triamine, such as diethylene triamine, and a nonpolar or polar organic solvent, such as N-methyl pyrrolidone. This composition will remove positive photoresist from semiconductor wafers, even after ion implantation into the wafers through the positive photo-resist. The wafers are immersed in the composition, for example, at a temperature of 110° C. for five minutes, in an ultrasonic bath after heavy ion implantation doses through the photoresist, such as $1 \times 10^{16}$ ions/cm$^2$, for complete removal of the photoresist. Prebaking the photoresist at a temperature of between about 150° and 220° C. for a time of from about 15 minutes to about 30 minutes, prior to stripping the positive organic photoresist layer with the triamine, enhances the removal.

10 Claims, No Drawings

TRIAMINE POSITIVE PHOTORESIST STRIPPING COMPOSITION AND PREBAKING PROCESS

BACKGROUND OF THE INVENTION

1. Field of the Invention

This invention relates to an improved stripping composition and process for removing ion implanted positive photoresist and other difficult to remove polymeric layers from substrates. More particularly, it relates to such a composition and process which is more aggressive in the removal of ion implanted positive photoresist and similar difficult to remove polymeric layers without causing damage to the underlying substrate. It further relates to a novel prebaking process for making positive photoresist easier to remove with stripping solutions.

2. Description of the Prior Art

Stripping compositions utilizing various amine compounds for the removal of positive photoresist from semiconductor wafers having insulating and/or conductive patterns defined on their surfaces using the photoresist during the manufacture of integrated circuits are known in the art. For example, Posistrip 830, available from EKC Technology, Hayward, CA 94540, is the most aggressive commercially available stripper for positive photoresist. The principal active ingredient of Posistrip 830 is 2,(-2 aminoethoxy)ethanol. Another material that is used for this purpose is N-methyl pyrrolidone.

In very large scale integration (VLSI) fabrication, ion implantation is used to add dopant atoms to silicon or other semiconductor material to change the conductivity of the semiconductor material. Examples of such dopants include donor atoms, or n-type dopants, such as phosphorus, arsenic or antimony and acceptor atoms, or p-type dopants, such as boron, aluminum or gallium. The superiority of ion implantation over diffusion doping methods for this purpose has caused it to replace diffusion doping in an increasing number of applications.

To restrict the ionic species from being implanted into unwanted substrate regions, an appropriate masking layer needs to be present on the wafer surface, with openings in the areas where implantation is desired. Many materials are used for such masking purposes in integrated circuit fabrication, including photoresist, $SiO_2$, $Si_3N_4$, polysilicon, metal films, and polyimide.

A thin layer of $SiO_2$ of, for example, 200–300 Angstroms thickness is usually added in the openings to provide a protective screen against contamination by metals or other impurities during implant. Higher energy implanters are needed, especially for arsenic implants, when this is done as the implanting beam must first penetrate the screening layer in the openings, during which time it loses energy, before arriving at the semiconductor substrate. Modern VLSI processes employ implant doses ranging from about $10^{11}$ to $10^{16}$ ions/cm$^2$. After heavy doses, a photoresist masking layer may become difficult to remove.

As a result of such removal difficulties, the most common method for removing ion implanted photoresist is an oxygen plasma process, which is time consuming and expensive. Commercially available photoresist stripping solutions, including the Posistrip 830 solution and the N-methyl pyrrolidone mentioned above, have not proven to be suitable for stripping such ion implanted photoresist, especially at heavy dosing levels. The state of the ion implantation processing art is discussed in Stanley Wolf and Richard N. Tauber, *Silicon Processing for the VLSI Era*, Chapter 9, "Ion Implantation for VLSI", pp. 280–330, including the difficulty of stripping ion implanted photoresist.

SUMMARY OF THE INVENTION

Accordingly, it is an object of this invention to provide a stripping solution and process for stripping positive photoresist which will completely and reliably remove photoresist that has been subjected to ion implantation, especially at heavy ion implantation doses.

It is another object of the invention to provide such a stripping solution and process which is usable with commonly used commercially available positive photoresists.

It is still another object of the invention to provide such a stripping solution and process for ion implanted positive photoresist which is suitable for use in modern VLSI processing.

It is a further object of the invention to eliminate the need to use oxygen plasma equipment and processes to remove ion implanted positive photoresist and other difficult-to-remove polymeric materials from substrates.

It is still another object of the invention to provide an improved process for removing positive photoresist with a stripping liquid which makes the positive photoresist easier to remove.

These and related objects may be achieved through use of the novel stripping solution and process for stripping positive photoresist and other difficult to remove polymeric coatings from substrates herein disclosed. A positive photoresist in accordance with this invention has a triamine as its principal active ingredient.

The stripping composition should contain from about 25 weight percent to about 100 weight percent of the triamine and from about 0 weight percent to about 75 weight percent of a suitable polar or nonpolar organic solvent.

The process for stripping positive photoresist from a substrate in accordance with this invention comprises contacting the positive photoresist with the above triamine composition at a temperature and time sufficient to remove the photoresist, typically at a temperature of about 80° C. to about 120° C. for a time of from about one minute to about 20 minutes.

In another aspect of the process of this invention, a positive organic photoresist layer is formed on a semiconductor wafer. An opening is created in the positive organic photoresist layer corresponding to a desired doping area in the semiconductor wafer. The semiconductor wafer is doped by ion implanting a dopant impurity into the semiconductor wafer through the opening in the positive organic photoresist layer. The positive organic photoresist layer on the semiconductor wafer is prebaked at a temperature and for a time sufficient to make the positive organic photoresist layer more readily removable with a stripping liquid for the positive organic photoresist. The positive organic photoresist layer is then contacted with a liquid photoresist stripper for the positive organic photoresist for a time sufficient to remove the positive organic photoresist layer from the semiconductor wafer.

Because of their strong alkalinity, the triamine stripping solutions of this invention are able to remove ion implanted positive photoresist, even at heavy doses employed for VLSI fabrication. At the same time, these solutions do not attack the substrate materials commonly employed in integrated circuit fabrication, including silicon, silicon dioxide, silicon nitride and gallium arsenide under normal processing conditions. While the prebaking process is especially advantageous when used in conjunction with the triamine stripping solutions, such a prebaking process also makes positive organic photoresist easier to remove with other stripping liquids for the positive organic photoresist after ion implantation in the presence of the positive organic photoresist.

The attainment of the foregoing and related objects, advantages and features of the invention should be more readily apparent to those skilled in the art, after review of the following more detailed description of the invention.

DETAILED DESCRIPTION OF THE INVENTION

Positive photoresists are based on the use of a novolac matrix resin and, typically, a diazoquinone photoactive compound or sensitizer. Novolac resins are soluble in common organic solvents and are also soluble in aqueous base solutions by virtue of the acidic characteristic of their phenolic functionality. The diazoquinone derivatives are soluble in common organic solvents but are insoluble in aqueous bases. Upon exposure to light, these substances undergo a series of reactions that culminate in the formation of an indene carboxylic acid. The photoproduct, unlike its precursor, is extremely soluble in aqueous bases by virtue of its carboxylic acid functionality. These substances will react with transition and non-transition metals, such as phosphorous, arsenic, and antimony to create a vast chemistry of organometallic compounds. During ion implantation, the photoresist is exposed to high energy bombardment, which is an ideal environment for the formation of the organometallic compounds. These organometallic compounds have different solubility properties, which make them difficult to solubilize in common solvents, and they are also impervious to strong oxidizing agents, such as sulfuric acid. The present process preferably uses a combination of a high temperature prebake, strongly alkaline solvents, a diethylene triamine and ultrasonic vibration to remove the metallized film by a lift off process. The high temperature prebake of the organometallic film ensures that the formation of the organometallic film is completed.

The prebaking step is carried out at a temperature of between about 150° and 220° C., preferably between about 180° and 200° C., for a time of from about 15 minutes to about 30 minutes. The shorter times are used with the higher temperatures.

Triamines which are useful in the composition and process of this invention have the general formula

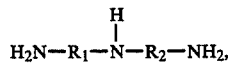

wherein $R_1$ and $R_2$ are, independently in each case, a difunctional straight or branched chain hydrocarbyl or substituted hydrocarbyl group having from about 2 to about 20 carbon atoms, including straight and branched chain, heterocyclic, aromatic, halogen, hydroxy and cyano substituted aliphatic groups. Suitable specific examples of operable triamines for the composition and process of this invention include diethylene triamine, 1 benzyl- and 1 cyanoethyl- substituted diethylene triamine, 1,2 dibenzyl diethylene triamine, lauryl diethylene triamine, N-(2 hydroxyethyl) diethylene triamine, N-(2 hydroxypropyl) diethylene triamine, and the like. The preferred triamine is diethylene triamine.

Suitable specific examples of polar organic solvents for the composition and process include N-methyl pyrrolidone, dimethyl formamide, butyrolactone, glycol ether, glycol ether acetal, and the like. The preferred polar organic solvents are N-methyl pyrrolidone and dimethyl formamide. Suitable specific examples of nonpolar organic solvents include aliphatic and aromatic hydrocarbon and chlorinated hydrocarbon solvents, such as benzene, alkylbenzenes, mineral spirits, and the like. The preferred nonpolar organic solvents are aromatic and chlorinated solvents. The solvents may be used singly or as mixtures. High boiling point solvents should be used, due to the elevated temperatures employed in the process.

The preferred composition range is from about 40 to about 75 weight percent of the triamine and from about 60 to about 25 weight percent of the organic solvent, with about 50 weight percent of each component being especially preferred.

It is preferred to subject the photoresist to be stripped with the composition and process of this invention to ultrasonic energy while contacting the photoresist with the triamine composition to assist in complete removal of the photoresist, particularly after subjecting the photoresist to higher dose levels of ion implantation. Conventional conditions for the application of the ultrasonic energy are employed for this purpose, such as through the use of an ultrasonic transducer operating at a frequency of about 30 to 50 MHz and a power of from about 0.1 to about 2.5 watts/in$^3$ mounted externally on a container holding the photoresist coated wafers and the triamine stripping composition.

The composition and process of this invention is suitable for use with all of the commonly employed positive photoresists used in the semiconductor industry. Examples of suitable positive photoresists include Shipley 1325 and 1822 resists, MacDermid EPA 914 resist, Kodak 820 and 825 resists and Dyna-Chem Thiokol OFPR-800 resist, and the like.

The following non-limiting examples represent preferred forms and best modes contemplated by the inventor for practice of his invention, as well as illustrating the results obtained through its use.

EXAMPLE 1

Silicon dioxide coated silicon wafers were primed with hexamethyl disilizane (HMDS) and commercially available Kodak 825, OFPR-800, Shipley 1375 and 1822 and MacDermid 914 photoresists were spun on and baked at 150° C. for 30 minutes, in accordance with the instructions of each photoresist supplier. The photoresist coated wafers were implanted with arsenic at energy levels of 80, 100, 120 and 150 KeV at dosage levels of $1 \times 10^{10}$ and $1 \times 10^{16}$ ions/cm$^2$. The photoresist was then stripped in 40 and 50 weight percent solutions of diethylene triamine in N-methyl pyrollidone using the following procedure: The wafers were pre-baked at 180° C. for 15 minutes. 600 ml of the diethylene triamine stripping solutions were placed in a beaker and heated to 90°±5° C. The wafers were put in the stripper solution for two to five minutes, transferred to a deionized water dump rinser for five minutes and visually inspected for photoresist residue, giving the results shown in Table 1. For comparative purposes, wafers prepared according to the above procedure were also stripped with commercially available Posistrip 830 diglycolamine solution.

TABLE I

| Implant Energy (KeV) | Solution A 50% triamine/ 50% NMP | Solution B 40% triamine/ 60% NMP | Posistrip 830 |
|---|---|---|---|
| Implant Dose: $1 \times 10^{10}$ | | | |
| 80 | Complete Removal by Dissolving in 2 minutes | Complete Removal by Dissolving in 5 minutes | Non-removal |
| 100 | Complete Removal by Dissolving in 2 minutes | Complete Removal by Dissolving in 5 minutes | Non-removal |
| 120 | Complete Removal by Dissolving in 2 minutes | Complete Removal in 5 minutes by Lift Off | Non-removal |
| 150 | Complete Removal by Dissolving in 2 minutes | Complete Removal in 5 minutes by Lift Off | Non-removal |
| Implant Dose: $1 \times 10^{16}$ | | | |
| 80 | 95% Removal | 80% Removal | Non-removal |
| 100 | 80% Removal | 75% Removal | Non-removal |
| 120 | 60% Removal | 50% Removal | Non-removal |
| 150 | 50% Removal | 30% Removal | Non-removal |

The above results show that the diethylene triamine solutions successfully stripped the photoresists at ion implanted dosage levels of $1 \times 10^{10}$ ions/cm$^2$ by dissolving the photoresist and produced incomplete photoresist removal at ion implanted dosage levels of $1 \times 10^{16}$ ions/cm$^2$. The diglycolamine solution failed to remove the photoresist at both dosage levels.

EXAMPLE 2

The procedure of Example 1 was repeated, but with arsenic ion implanted dosage level wafers of $1 \times 10^{16}$ ions/cm$^2$, a stripping solution temperature of $100° \pm 5°$ C., a stripping time of from 1 to 5 minutes and with the heated stripping solutions in an ultrasonic bath with an external ultrasonic transducer operating at 40 Mhz and a power level of 0.2 Watts/ins. The results obtained are shown below in Table II.

TABLE II

| Implant Dose: $1 \times 10^{16}$ | | | |
|---|---|---|---|
| Implant Energy (KeV) | Solution A 50% triamine/ 50% NMP | Solution B 40% triamine/ 60% NMP | Posistrip 830 |
| 80 | Complete Removal in 1 minute | Complete Removal in 1 minute | Non-removal |
| 100 | Complete Removal in 1 minute | Complete Removal in 1 minute | Non-removal |
| 120 | Complete Removal in 1 minute | Complete Removal in 1 minute | Non-removal |
| 150 | Complete Removal in 1 minute | Complete Removal in 1 minute | Non-removal |

The above results show that the diethylene triamine solutions successfully stripped the photoresists at the heavy ion implanted dosage level by a lift off process, but the diglycolamine solution again was unable to remove the photoresists.

EXAMPLE 3

The diethylene triamine solutions as in Example 1 were used to strip photoresist coated wafers prepared as in Example 1, but with no prebake of the photoresist on the wafers and with N-methyl pyrrolidone alone used as a comparative stripper. 600 ml of the diethylene triamine stripping solutions were placed in a beaker and heated to 110° C. The wafers were put in the stripping solution for five minutes, transferred to a deionized water dump rinser or a spray rinser for 5 minutes and visually inspected for photoresist residue. The diethylene triamine solutions successfully stripped the photoresists at ion implanted dosage levels of $1 \times 10^{10}$ ions/cm$^2$ by dissolving the photoresist and produced 65% photoresist removal at ion implanted dosage levels of $1 \times 10^{16}$ ions/cm$^2$. With the use of N-methyl pyrrolidone alone, only 45% photoresist removal was obtained at both dosage levels.

EXAMPLE 4

The diethylene triamine solutions as in Example 1 were used to strip photoresist coated wafers prepared as in Example 1, but with no prebake of the photoresist on the wafers, with applying ultrasonic energy during the photoresist stripping using the following procedure. A quantity of 2 gallons of diethylene triamine stripping solutions were placed in a five gallon tank with an external ultrasonic transducer and heated to 110° C. The wafers were put in the stripping solution for five minutes with the external ultrasonic transducer operating at 40 Mhz and a power level of 0.7 watts/in$^3$. The wafers were then transferred to a deionized water pump rinser or spray rinser for 5 minutes and visually inspected for photoresist residue. The diethylene triamine solutions successfully stripped the photoresists at ion implanted dosage levels of $1 \times 10^{10}$ ions/mm$^2$ by dissolving the photoresist and produced 80% photoresist removal at ion implanted dosage levels of $1 \times 10^{16}$ ions/cm$^2$. A 100 percent removal of the photoresists was obtained at the higher dose level by increasing the stripping time to 30 minutes.

EXAMPLE 5

The diethylene triamine solutions as in Example 1 were used to strip photoresist coated wafers prepared as in Example 1, including the prebaking step, but without application of ultrasonic energy, using the following procedure. A quantity of 600 ml. of the diethylene triamine solution was placed in a beaker and heated to 10° C. The wafers were put in the stripping solution five minutes, transferred to a deionized water pump rinser or spray rinser for 5 minutes and visually inspected for photoresist residue. The results showed that the diethylene triamine solutions successfully stripped the photoresists at ion implanted dosage levels of $1 \times 10^{10}$ ions/cm$^2$ by dissolving the photoresists and produced 75% photoresist removal at the higher ion implantation dose level.

EXAMPLE 6

The diethylene triamine solutions as in Example 1 were used to strip photoresist coated wafers prepared as in Example 1, including the prebaking step, with applying ultrasonic energy during the photoresist stripping and with N-methyl pyrrolidone alone used as a comparative stripper using the following procedure. A quantity of 2 gallons of diethylene triamine stripping solutions were placed in a five gallon tank with an external ultrasonic transducer and heated to 110° C. The wafers were put in the stripping solution for five minutes with the external ultrasonic transducer operating at 40 Mhz and a power level of 0.7 watts/in$^3$. The wafers were then transferred to a deionized water pump rinser or spray rinser for 5 minutes and visually inspected for photoresist residue. The diethylene triamine solutions successfully stripped the photoresists at ion implanted dosage levels of $1 \times 10^{10}$ ions/cm$^2$ by dissolving the photoresist and produced 100% photoresist removal at ion implanted dosage levels of $1 \times 10^{16}$ ions/cm$^2$. The diethylene triamine solutions successfully stripped the photoresists at the higher ion implantation dosage level by a lift off process, but N-methyl pyrrolidone produced incomplete photoresist removal at both dosage levels.

EXAMPLE 7

Wafers prepared according to the procedure of Example 1, but ion implanted with boron at 150 KeV and a dosage level of $1 \times 10^{15}$ ions/cm$^2$ were stripped in a solution consisting of 75 weight percent diethylene triamine in dimethyl formamide, using the stripping procedure of Example 6. The results showed 100% removal of the photoresists within 5 minutes stripping time.

Substitution of other triamines in the procedures of the above examples produces equivalent advantageous results.

It should now be readily apparent to those skilled in the art that a novel photoresist stripping composition and process capable of achieving the stated objects of the invention has been provided. The triamine solution and process completely removes ion implanted positive photoresist from semiconductor wafers without attacking the wafers, even at high ion implantation dosing levels. The composition and process is suitable for use with the commonly employed positive photoresists used in VLSI integrated circuit fabrication.

It should further be apparent to those skilled in the art that various changes in form and details of the invention as shown and described may be made. It is intended that such changes be included within the spirit and scope of the claims appended hereto.

What is claimed is:

1. A composition for the removal of a positive organic photoresist from a substrate, which comprises a triamine having the general formula:

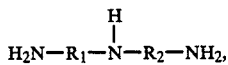

wherein $R_1$ and $R_2$ are, independently in each case, a difunctional straight or branched chain hydrocarbyl or substituted hydrocarbyl group having from about 2 to about 20 carbon atoms in sufficient amounts to remove the photoresist from the substrate and a nonpolar aliphatic or aromatic hydrocarbon or chlorinated hydrocarbon or polar pyrrolidone, dimethyl formamide or butyrolactone organic solvent.

2. The composition of claim 1 in which the triamine is diethylene triamine.

3. the composition of claim 2 in which the organic solvent is N-methyl pyrrolidone or dimethyl formamide.

4. The composition of claim 1 in which the triamine is present in an amount of from about 40 to about 75 weight percent and the organic solvent is present in an amount of from about 60 weight percent to about 25 weight percent.

5. A composition for the removal of a positive organic photoresist from a substrate, which comprises diethylene triamine in sufficient amounts to remove the photoresist from the substrate and an N-methyl pyrrolidone or dimethyl formamide solvent, the diethylene triamine being precent in an amount from about 40 to about 75 weight percent and the N-methyl pyrrolidone or dimethyl formamide solvent being present in an amount of from about 60 weight to about 25 weight percent.

6. A process for stripping positive organic photoresist from a substrate, which comprises contacting the positive organic photoresist with a triamine having the general formula:

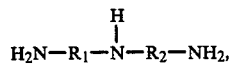

wherein $R_1$ and $R_2$ are, independently in each case, a difunctional straight or branched chain hydrocarbyl or substituted hydrocarbyl group having from about 2 to about 20 carbon atoms at a temperature of at least about 80° C. for a time sufficient to remove the positive organic photoresist from the substrate.

7. The process of claim 6, in which the positive organic photoresist is contacted with the triamine at a temperature between about 80° C. to about 120° C. for a time of from about 1 minute to about 20 minutes.

8. The process of claim 7 in which the substrate is a semiconductor wafer.

9. The process of claim 6 in which the triamine is diethylene triamine.

10. The process of claim 6 in which the positive photoresist contains dopant impurities.

* * * * *